(12) United States Patent
Huang

(10) Patent No.: US 8,289,070 B2
(45) Date of Patent: Oct. 16, 2012

(54) FUSE CIRCUIT

(75) Inventor: Pei-Jey Huang, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 99 days.

(21) Appl. No.: 12/946,894

(22) Filed: Nov. 16, 2010

(65) Prior Publication Data

US 2012/0119820 A1    May 17, 2012

(51) Int. Cl.
*H01H 37/76* (2006.01)

(52) U.S. Cl. ......................................... 327/525

(58) Field of Classification Search ................... 327/524, 327/525, 526
See application file for complete search history.

(56) References Cited

U.S. PATENT DOCUMENTS

| | | | | |
|---|---|---|---|---|
| 5,345,110 | A * | 9/1994 | Renfro et al. | 327/199 |
| 7,091,768 | B2 * | 8/2006 | Lee | 327/525 |
| 7,395,475 | B2 * | 7/2008 | Do | 714/734 |
| 7,525,368 | B2 * | 4/2009 | Shih | 327/525 |
| 7,733,158 | B2 * | 6/2010 | Huang et al. | 327/525 |

* cited by examiner

*Primary Examiner* — Jeffrey Zweizig
(74) *Attorney, Agent, or Firm* — Stites & Harbison, PLLC; Juan Carlos A. Marquez, Esq

(57) ABSTRACT

A fuse circuit comprises a fuse set and an enable circuit. The enable circuit is configured to receive a test mode enable signal and a power up signal to generate an enable signal and a voltage level to the fuse set for indicating whether an external supply voltage reaches a predetermined value and whether a test mode is enabled. In particular, an output signal of the fuse set is constant in the test mode, regardless of whether a fuse in the fuse set is blown or not.

12 Claims, 4 Drawing Sheets

FUSE CIRCUIT

BACKGROUND OF THE INVENTION

1. Field of the Invention

The present invention relates to a fuse circuit, and more particularly, to a fuse circuit which can operate in either normal mode or test mode.

2. Description of the Related Art

Modern integrated circuits such as Dynamic Random Access Memory (DRAM) often require multiple internal voltages to be applied to the integrated circuit. However, such supply voltages often fluctuate due to variations in temperature, the fabrication process, or positioning of chips on the wafer. To minimize the variation in response to the external factors, fuses are often utilized to control the voltage levels.

FIG. 1 shows a conventional fuse circuit 10 in which a fuse $R_1$ is connected to a PMOS transistor $P_1$, an NMOS transistor $N_1$, and a latch circuit 12. The latch circuit 12 is composed of inverters $X_1$ and $X_2$. The operation of the fuse circuit 10 is illustrated below. When a supply voltage $V_{CC}$ rises from 0 volt to a predetermined voltage level, a power up signal PU applied to a PMOS transistor $P_1$ is at a logic low level and thus the latch circuit 12 sends a logic low signal from its output node F. When the supply voltage $V_{CC}$ reaches the predetermined voltage level, the power up signal PU switches from logic low level to logic high level, rendering the PMOS transistor $P_1$ non-conductive. Therefore, the voltage at node F is determined according to a conductivity state of the fuse $R_1$. If the fuse $R_1$ is blown and changes to an open state, the voltage at node F remains the previous logic low level. Otherwise, the voltage at node F changes to a logic high level since the fuse $R_1$ is not blown and the transistor $N_1$ is turned on.

The voltage at node F is then sent to a decoder (not shown). The decoder serves to decode signals from a plurality of fuse circuits for generating a plurality of trim bits, wherein the trim bits serve to adjust the level of reference voltages in response to changes in the external environment. Therefore, by improving the voltage variation of the reference voltages, the yield can be remarkably increased.

However, in the conventional fuse circuit 10, after the voltage at node F is activated by blowing the fuse $R_1$, the voltage at node F cannot be reverted again. In the conventional configuration, there is a shortcoming that the device cannot perform the function of the test mode after the fuse is blown. FIG. 2 shows a fuse disposing circuit 20 disclosed in U.S. Pat. No. 7,395,475, wherein the fuse disposing circuit 20 can operate in either normal mode or test mode. The circuit 20 comprises a test mode enable confirmation section 230, a plurality of fuse sets 210a, 210b, 210c, and a decoder 220. The test mode enable confirmation section 230 sends a signal tm_enb to the fuse sets 210a-210c when the test mode is enabled. Each of the fuse sets 210a-210c further comprises a comparison circuit (not shown) to render the output of the circuit 20 at a constant logic level regardless of whether the fuse is blown in the test mode. Because the comparison circuit is required for each of the fuse sets, the semiconductor chip is area-consuming and the cost of manufacturing the semiconductor chip is high.

Therefore, there is a need to provide a fuse circuit which can operate in either normal mode or test mode.

SUMMARY OF THE INVENTION

An aspect of the present invention is to provide a fuse circuit which can operate in either normal mode or test mode.

According to one embodiment of the present invention, the fuse circuit comprises a fuse set and an enable circuit. The enable circuit is configured to receive a test mode enable signal and a power up signal to generate an enable signal and a voltage level to the fuse set for indicating whether an external supply voltage reaches a predetermined value and whether a test mode is enabled. In particular, an output signal of the fuse set is constant in the test mode, regardless of whether a fuse in the fuse set is blown.

According to another embodiment of the present invention, the fuse comprises a plurality of fuse sets, an enable circuit and a decoder. The enable circuit is configured to receive a test mode enable signal and a power up signal to generate an enable signal and a voltage level to the plurality of fuse sets for indicating whether an external supply voltage reaches a predetermined value and whether a test mode is enabled. The decoder is configured to receive and decode output signals of the plurality of fuse sets. In particular, the output signals of the fuse sets are constant in the test mode, regardless of whether a fuse in each of the fuse sets is blown.

BRIEF DESCRIPTION OF THE DRAWINGS

The invention will be described according to the appended drawings in which.

DETAILED DESCRIPTION OF THE INVENTION

Figure 1:
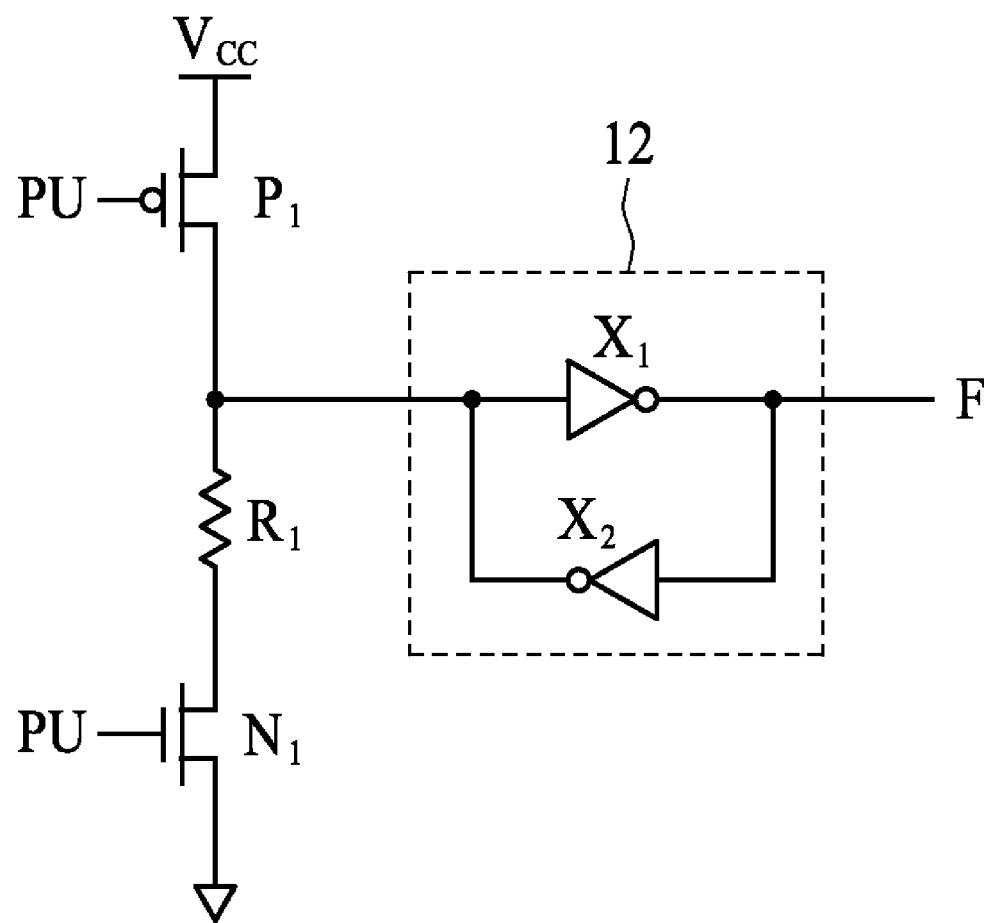
FIG. 1 shows a conventional fuse circuit.
Figure 2:
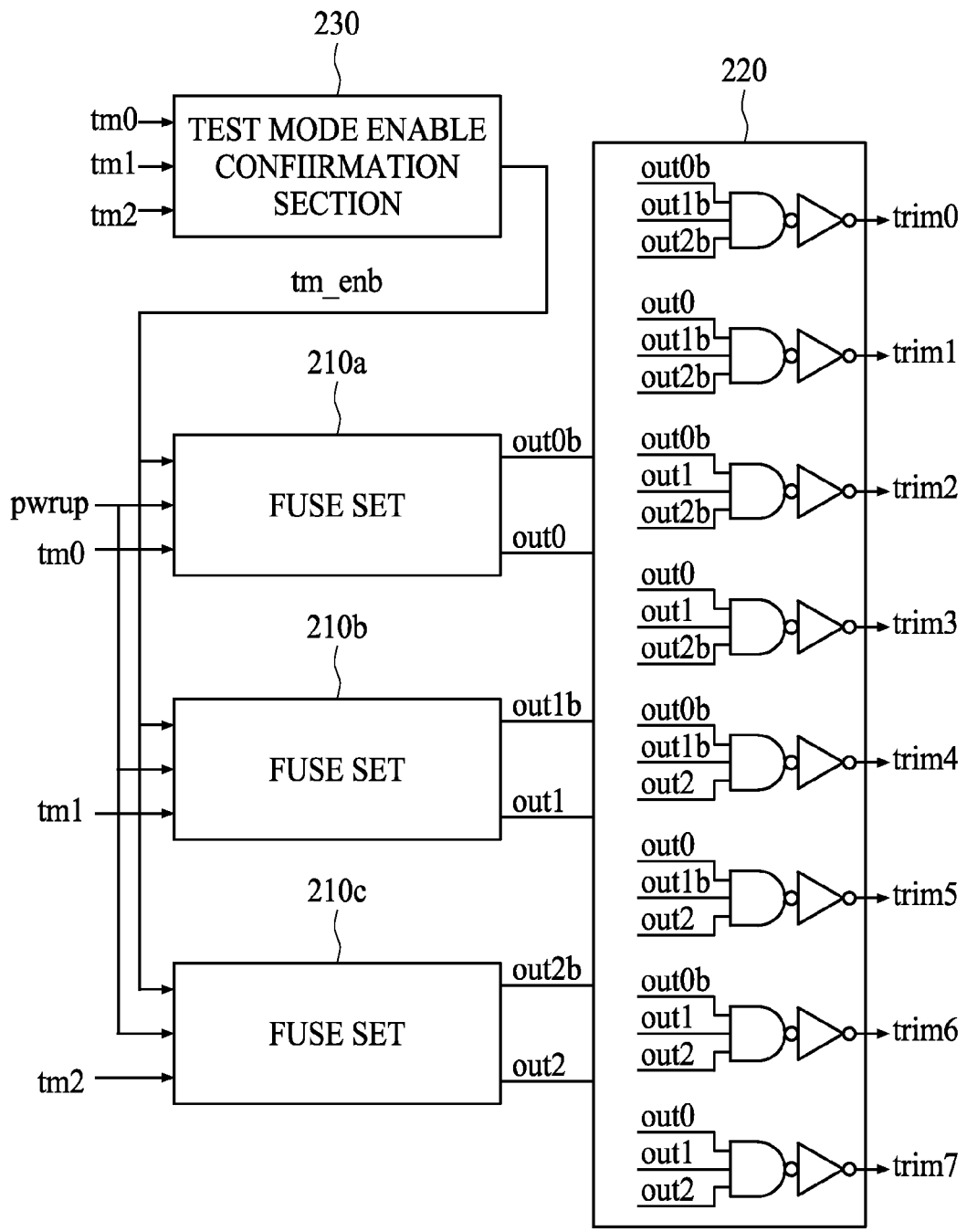
FIG. 2 shows a fuse disposing circuit disclosed in U.S. Pat. No. 7,395,475.
Figure 3:
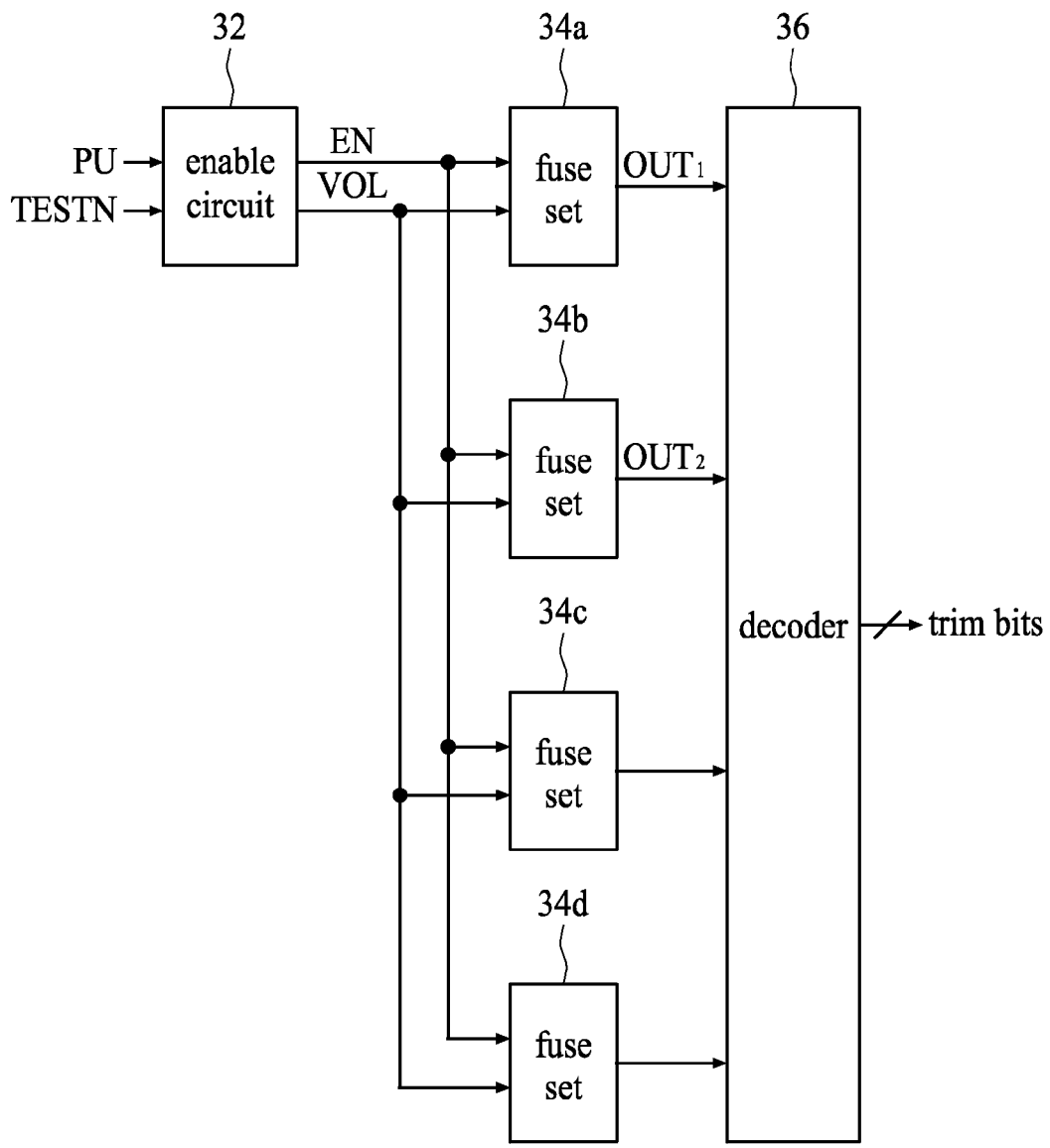
FIG. 3 shows a block diagram of a fuse circuit according to one embodiment of the present invention.

FIG. 3 shows a block diagram of a fuse circuit 30 according to one embodiment of the present invention. As shown in FIG. 3, the fuse circuit 30 comprises an enable circuit 32 and a plurality of fuse sets 34a, 34b, 34c, and 34d. The enable circuit 32 is configured to receive a test mode enable signal TESTN and a power up signal PU, and to provide an enable signal EN and a voltage level VOL to the plurality of fuse sets 34a, 34b, 34c, and 34d for indicating whether an external supply voltage $V_{CC}$ reaches a predetermined value and whether a test mode is enabled.

Figure 4:
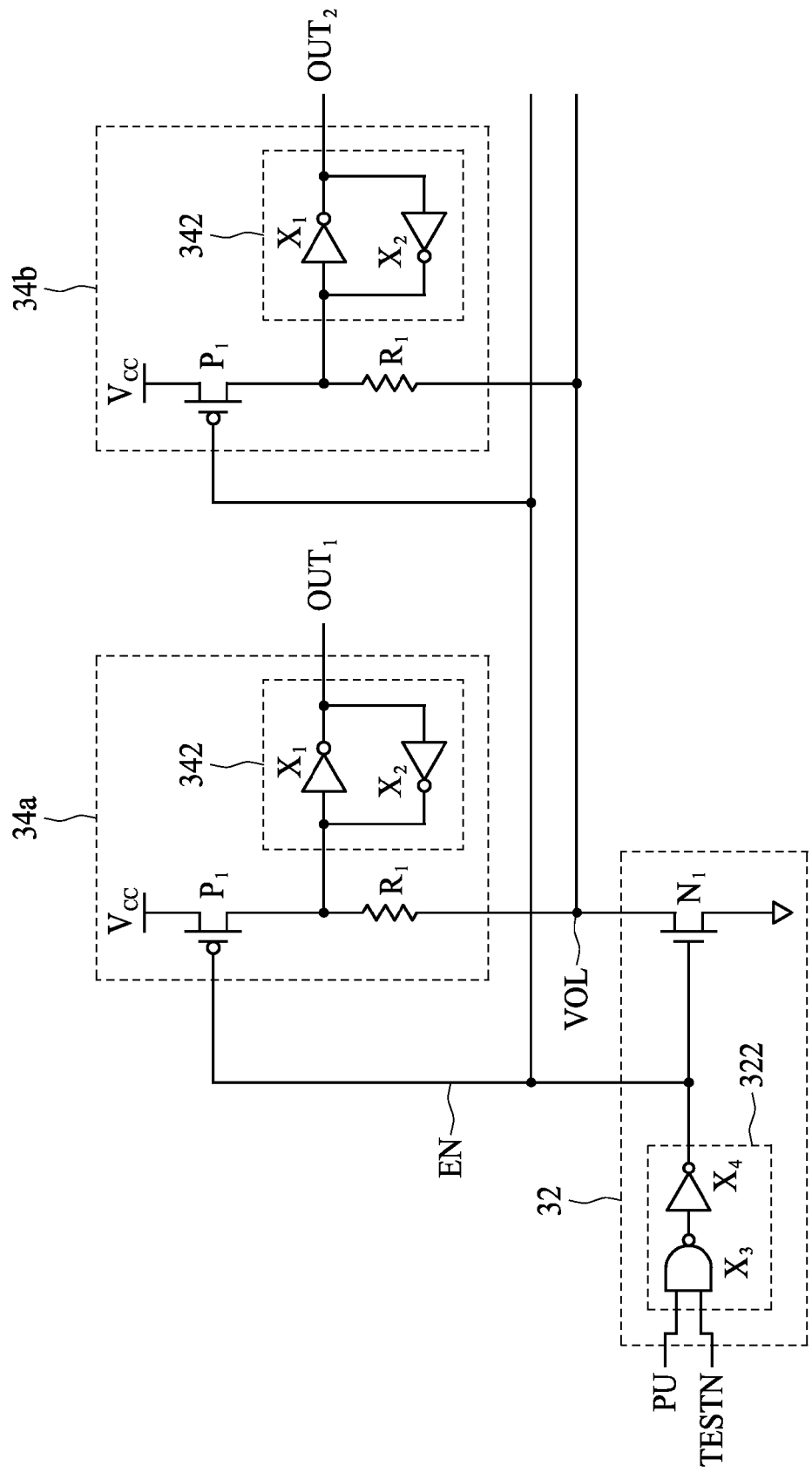
FIG. 4 shows a circuit diagram of an enable circuit and fuse sets according to one embodiment of the present invention.

FIG. 4 shows a circuit diagram of the enable circuit and the fuse sets according to one embodiment of the present invention. Since the plurality of fuse sets 34a, 34b, 34c, and 34d have the same circuit configuration and perform the same operation, only the fuse set 34a will be described herein in detail for the sake of illustration.

Referring to FIG. 4, the enable circuit 32 comprises a logic circuit 322 and an NMOS transistor $N_1$. According to one embodiment of the present invention, the logic circuit 322 is composed of a NAND gate $X_3$ and an inverter $X_4$. As shown in FIG. 4, the logic circuit 322 is configured to receive the test mode enable signal TESTN and the power up signal PU, and to generate the enable signal EN in response to logic levels of the test mode enable signal TESTN and the power up signal PU. The NMOS transistor $N_1$ has a gate configured to receive the enable signal EN, a drain connected to the fuse sets 34a, 34b, 34c, and 34d, and a source connected to a ground voltage.

Referring to FIG. 4, the fuse set 34a comprises a fuse $R_1$, a PMOS transistor $P_1$, and a latch unit 342. The fuse $R_1$ may be made of a metal material or a poly material, and can be cut by drawing current or applying a laser beam to the narrow portion of the fuse. The PMOS transistor $P_1$ has a gate configured to receive the enable signal EN, a drain connected to the fuse $R_1$, and a source connected to the external supply voltage $V_{CC}$. The latch unit 342 is composed of inverters $X_1$ and $X_2$. The latch unit 342 has an input terminal connected to the drain of the PMOS transistor $P_1$ and the fuse $R_1$, and has an output terminal as an output terminal of the fuse set 34a.

The operation of the fuse circuit 30 is as follows. If the fuse circuit 30 operates in a normal mode, i.e., if the test mode enable signal TESTN is applied to the fuse circuit 30 as a logic high level, then the output signal $OUT_1$ of the fuse set 34a depends on the power up signal PU and the status of the fuse $R_1$. When the external supply voltage $V_{CC}$ rises from 0 volt to a predetermined voltage level, the power up signal PU is at a logic low level, so that the enable circuit 32 generates the enable signal EN at a logic low level. Therefore, the NMOS transistor $N_1$ is turned off, and a floating voltage VOL is generated at the drain of the NMOS transistor $N_1$. The PMOS transistor $P_1$ is turned on and thus the latch unit 342 sends the output signal $OUT_1$ at a logic low level from its output terminal.

When the supply voltage $V_{CC}$ reaches the predetermined voltage level, the power up signal PU switches from logic low level to logic high level, rendering the PMOS transistor $P_1$ non-conductive and the NMOS transistor $N_1$ conductive. Therefore, the output signal $OUT_1$ of the fuse set 34a is determined based on the status of the fuse $R_1$. If the fuse $R_1$ is not blown, the fuse set 34a generates the output signal $OUT_1$ at a logic high level; otherwise, the fuse set 34a generates the output signal $OUT_1$ at a logic low level. Similarly, the fuse set 34b, 34c and 34d generates output signals $OUT_2$, $OUT_3$, and $OUT_4$, respectively, according to the status of the corresponding fuse $R_1$. The output signals $OUT_1$-$OUT_4$ are then sent to a decoder 36 shown in FIG. 3 to generate multiple trim bits for internal circuits.

If the fuse circuit 30 operates in a test mode, i.e., if the test mode enable signal TESTN is applied to the fuse circuit 30 as a logic low level and the power up signal PU is at a logic high level, then the output signal $OUT_1$ of the fuse set 34a is constant, regardless of whether the fuse $R_1$ is blown or not. In this condition, the NMOS transistor $N_1$ is turned off, and a floating voltage VOL is generated at the drain of the NMOS transistor $N_1$. The PMOS transistor $P_1$ is turned on and thus the latch unit 342 sends the output signal $OUT_1$ at a logic low level from its output terminal, regardless of whether the fuse $R_1$ is blown.

The present invention having the configurative features as mentioned above has advantages that it can operate in either normal mode or test mode. When the fuse circuit operates in a normal mode, output signals at logic high level or logic low level are generated according to the status of the fuse. On the other hand, when the fuse circuit operates in a test mode, the output signals of the fuse circuit are constant, regardless of whether the fuse is blown or not.

The above-described embodiments of the present invention are intended to be illustrative only. Numerous alternative embodiments may be devised by those skilled in the art without departing from the scope of the following claims.

What is claimed is:

1. A fuse circuit, comprising:
   a fuse set; and
   an enable circuit configured to receive a test mode enable signal and a power up signal to generate an enable signal and a voltage level to the fuse set for indicating whether an external supply voltage reaches a predetermined value and whether a test mode is enabled;
   wherein an output signal of the fuse set is constant in the test mode, regardless of whether a fuse in the fuse set is blown or not, and
   wherein the enable circuit comprises:
      a logic circuit configured to receive the test mode enable signal and the power up signal and to generate the enable signal in response to logic levels of the test mode enable signal and the power up signal, and
      an NMOS transistor having a gate configured to receive the enable signal, a drain connected to the fuse set and configured to generate the voltage level, and a source connected to a low voltage level.

2. The fuse circuit of claim 1, wherein the enable circuit generates the enable signal at a logic high level when the external supply voltage reaches the predetermined value and when the test mode is disabled, so that the NMOS transistor is turned on and the low voltage level is generated at the drain of the NMOS transistor.

3. The fuse circuit of claim 1, wherein the enable circuit generates the enable signal at a logic low level when the level of the external supply voltage does not reach the predetermined value or when the test mode is enabled, so that the NMOS transistor is turned off and a floating voltage level is generated at the drain of the NMOS transistor.

4. The fuse circuit of claim 1, wherein the fuse set comprises:
   a fuse having a first terminal connected to a PMOS transistor and a second terminal configured to receive the voltage level from the enable circuit;
   the PMOS transistor having a gate configured to receive the enable signal, a drain connected to the fuse, and a source connected to the external supply voltage; and
   a latch unit having a first terminal connected to the drain of the PMOS transistor and having a second terminal as an output terminal of the fuse set.

5. The fuse circuit of claim 4, wherein the enable circuit generates the enable signal at a logic high level when the level of the external supply voltage reaches the predetermined value and when the test mode is disabled, so that the PMOS transistor is turned off and the output signal of the fuse set depends on the status of the fuse.

6. The fuse circuit of claim 4, wherein the enable circuit generates the enable signal at a logic low level when the level of the external supply voltage does not reach the predetermined value or when the test mode is enabled, so that the PMOS transistor is turned on and the output signal of the fuse set is constant, regardless of whether the fuse is blown or not.

7. A fuse circuit, comprising:
   a plurality of fuse sets;
   an enable circuit configured to receive a test mode enable signal and a power up signal so as to generate an enable signal and a voltage level to the plurality of fuse sets for indicating whether an external supply voltage reaches a predetermined value and whether a test mode is enabled; and
   a decoder configured to receive and decode output signals of the plurality of fuse sets;
   wherein the output signals of the fuse sets are constant in the test mode, regardless of whether a fuse in any of the fuse sets is blown or not, and
   wherein the enable circuit comprises:
      a logic circuit configured to receive the test mode enable signal and the power up signal and to generate the enable signal in response to logic levels of the test mode enable signal and the power up signal, and
      an NMOS transistor having a gate configured to receive the enable signal, a drain connected to the plurality of fuse sets and configured to generate the voltage level, and a source connected to a low voltage level.

8. The fuse circuit of claim 7, wherein the enable circuit generates the enable signal at a logic high level when the level of the external supply voltage reaches the predetermined value and when the test mode is disabled, so that the NMOS transistor is turned on and the low voltage level is generated at the drain of the NMOS transistor.

9. The fuse circuit of claim 7, wherein the enable circuit generates the enable signal at a logic low level when the level of the external supply voltage does not reach the predetermined value or when the test mode is enabled, so that the NMOS transistor is turned off and a floating voltage level is generated at the drain of the NMOS transistor.

10. The fuse circuit of claim 7, wherein the plurality of fuse sets each comprises:

a fuse having a first terminal connected to a PMOS transistor and a second terminal configured to receive the voltage level from the enable circuit;

the PMOS transistor having a gate configured to receive the enable signal, a drain connected to the fuse, and a source connected to the external supply voltage; and a latch unit having a first terminal connected to the drain of the PMOS transistor and having a second terminal as an output terminal of the fuse set.

11. The fuse circuit of claim 10, wherein the enable circuit generates the enable signal at a logic high level when the level of the external supply voltage reaches the predetermined value and when the test mode is disabled, so that the PMOS transistor is turned off, and the output signals of the fuse sets depend on the status of their corresponding fuses.

12. The fuse circuit of claim 10, wherein the enable circuit generates the enable signal at a logic low level when the level of the external supply voltage does not reach the predetermined value or when the test mode is enabled, so that the PMOS transistor is turned on, and the output signals of the fuse sets are constant, regardless of whether the fuses are blown or not.

* * * * *